United States Patent
Hynecek

(10) Patent No.: US 7,633,134 B2
(45) Date of Patent: Dec. 15, 2009

(54) STRATIFIED PHOTODIODE FOR HIGH RESOLUTION CMOS IMAGE SENSOR IMPLEMENTED WITH STI TECHNOLOGY

(76) Inventor: Jaroslav Hynecek, 905 Pampa Dr., Allen, TX (US) 75013

( * ) Notice: Subject to any disclaimer, the term of this patent is extended or adjusted under 35 U.S.C. 154(b) by 401 days.

(21) Appl. No.: 11/435,771

(22) Filed: May 18, 2006

(65) Prior Publication Data

US 2007/0158771 A1 Jul. 12, 2007

(30) Foreign Application Priority Data

Dec. 29, 2005 (KR) .................. 10-2005-0134243
Apr. 28, 2006 (KR) .................. 10-2006-0038536

(51) Int. Cl.
*H01L 31/103* (2006.01)
(52) U.S. Cl. ............... 257/440; 257/292; 257/E27.134
(58) Field of Classification Search ............... 257/222, 257/233, 440, E27.134, 292
See application file for complete search history.

(56) References Cited

U.S. PATENT DOCUMENTS

| 5,991,184 | A | 11/1999 | Russell et al. | |
|---|---|---|---|---|
| 6,489,643 | B1 | 12/2002 | Lee et al. | |
| 6,730,899 | B1 | 5/2004 | Stevens et al. | |
| 6,930,336 | B1 * | 8/2005 | Merrill | 257/292 |
| 6,956,273 | B2 | 10/2005 | Koizumi | 257/440 |
| 7,105,373 | B1 * | 9/2006 | Hopper et al. | 438/60 |
| 7,154,137 | B2 * | 12/2006 | Nozaki | 257/292 |
| 2005/0040445 | A1 * | 2/2005 | Mouli | 257/290 |

FOREIGN PATENT DOCUMENTS

| JP | 2003-298102 | 10/2003 |
|---|---|---|
| JP | 2005-332925 | 12/2005 |
| KR | 1020010004105 A | 1/2001 |
| KR | 1020020057250 A | 7/2002 |

* cited by examiner

*Primary Examiner*—Kenneth A Parker
*Assistant Examiner*—Paul A Budd
(74) *Attorney, Agent, or Firm*—McAndrews, Held & Malloy, Ltd.

(57) ABSTRACT

A stratified photodiode for high resolution CMOS image sensors implemented with STI technology is provided. The photodiode includes a semi-conductive layer of a first conductivity type, multiple doping regions of a second conductivity type, multiple doping regions of the first conductivity type, and a pinning layer. The multiple doping regions of the second conductivity type are formed to different depths in the semi-conductive layer. The multiple doping regions of the first conductivity type are disposed between the multiple doping regions of the second conductivity type and form multiple junction capacitances without full depletion. In particular, the stratified doping arrangement allows the photodiode to have a small size, high charge storage capacity, low dark current, and low operation voltages.

9 Claims, 4 Drawing Sheets

STRATIFIED PHOTODIODE FOR HIGH RESOLUTION CMOS IMAGE SENSOR IMPLEMENTED WITH STI TECHNOLOGY

FIELD OF THE INVENTION

The disclosed invention relates to a solid-state image sensor, and more specifically to a complementary metal oxide semiconductor (CMOS) image sensor with a stratified doping arrangement in a photodiode region. The stratified doping arrangement enables to form high-resolution sensors with very small pixel sizes, which have high charge storage capacity, high dynamic range, low dark current, and low operating voltage.

DESCRIPTION OF RELATED ARTS

Typically, an image sensor senses light by converting impinging photons into electrons that are integrated (collected) in sensor pixels. After completion of the integration cycle, collected charge is converted into a voltage, which is supplied to the output terminals of the image sensor. In CMOS image sensors, the charge-to-voltage conversion is accomplished directly in the pixels themselves, and the analog pixel voltage is transferred to the output terminals through various pixel addressing and scanning schemes. The analog signal can also be converted on-chip to a digital equivalent before reaching the chip output. The pixels have incorporated in them a buffer amplifier, typically a source follower, which drives sense lines that are connected to the pixels by suitable addressing transistors. After the charge-to-voltage conversion is completed and the resulting signal is transferred out from the pixels, the pixels are reset in order to be ready for accumulation of new charge. In pixels using a floating diffusion (FD) as a charge detection node, the reset is accomplished by turning on a reset transistor that momentarily conductively connects the FD node to a voltage reference. This step removes collected charge; however, the removal of the collected charge generates kTC-reset noise as is well known in the art. kTC noise has to be removed from the signal by a correlated double sampling (CDS) signal processing technique in order to achieve desired low noise performance. The typical CMOS sensors that utilize the CDS concept usually require four transistors (4T) in the pixel. An example of the 4T pixel circuit can be found in U.S. Pat. No. 5,991,184 issued to J. W. Russell et al.

A cross section of a typical photodiode used in many 4T pixel designs including a transfer gate and a FD node is shown in FIG. 1. An exemplary typical photodiode can be found in U.S. Pat. No. 6,730,899 B1 issued to E. G. Stevens et al.

In FIG. 1, the photodiode includes a p-type epitaxial layer 101 formed on a $p^+$-type substrate 112, an n-type doping region 103 and a shallow p-type doping region 102 located near a silicon-silicon dioxide interface. A thin oxide layer 104 (e.g., a silicon dioxide layer) is grown on top of a substrate structure that includes the photodiode and the $p^+$-type substrate 112, to electrically isolate a transfer gate 106 from the $p^+$-type substrate 112. A bias is delivered to the transfer gate 106 via a wire 108 shown schematically in the drawing. When a positive pulse is applied to the wire 108 contacting a FD node 107, the transfer gate 106 is turned on, and charge from the photodiode is transferred on the FD node 107. This charge transfer lowers an electric potential of the FD node 107.

Although not illustrated, a suitable amplifier, which may be connected to the FD node 107 via another wire 109, senses this change and transfers it to other circuits on the chip for further processing. The FD node bias change represents the desired photo-generated signal. After sensing is completed, the FD node 107 is reset by a suitable circuitry, also not shown in this drawing. After the reset, the FD node 107 becomes biased at a reset voltage level Vrs. The photo-generated signal results from photons 110 that enter the substrate structure (e.g., the silicon), and generate electron-hole pairs 113 and 114. The holes 114 flow into the $p^+$-type substrate 112 where the holes 114 join the majority carriers while the electrons 113 accumulate in the n-type doping region 103 in a potential well located in the $p^+$-type substrate 112.

The charge storage capability of the above described structure is schematically represented in this drawing by a capacitor Cs 105. When there is no mobile charge stored in the photodiode, an electric potential of the well in the n-type doping region 103 reaches a maximum level, called "pinned voltage Vpin." In order to transfer all the accumulated photo-generated charge from the photodiode (i.e., the well in the n-type doping region 103) onto the FD node 107, it is necessary that a minimum FD bias voltage Vfd-min is always higher than the pinned voltage Vpin. For obtaining the highest pixel performance, it is, therefore, necessary to have the largest possible voltage swing on the FD node 107, so that a difference between the reset voltage level Vrs and the minimum FD bias voltage Vfd-min should be large.

Concurrent to the above condition, the minimum FD bias voltage Vfd-min should be larger than the pinned voltage Vpin. This condition implies that the pinned voltage Vpin should be as low as possible. However, when the pinned voltage Vpin is low, it is difficult to store enough charge in the photodiode, because there is a certain practical limit to the value of the capacitance CS 105 that can be achieved. This result is a consequence of some material limitations of silicon and some limitation in processing. For small pixel sensors which may use a conventional approach to form a capacitance, the capacitance may become so small that not enough electrons would be stored in the pixels to generate a reasonable quality image with an intended level of high dynamic range (DR). The typical number of electrons required to be stored in the pixels for a good quality picture is more than 10,000. This number is difficult to achieve for sensors with pixel sizes on the order of 2.0 μm and smaller, which must operate at voltages below 3.0 V.

Another approach to improve integration of charge generated by impinging photons within an n-type doping region is described in U.S. Pat. No. 6,489,643 B1 issued to J. L. Lee et al. The improved charge integration can be achieved by configuring a stack structure of a p-type doping region and an n-type doping region, which are repeatedly and alternately stacked over each other, within the photodiode area. This stack structure increases a depletion region of a photodiode when a bias is applied.

FIG. 2 is a diagram illustrating a typical pinned photodiode structure with a stacked doping arrangement.

As illustrated, the pinned photodiode PPD includes a first n-type doping region 706, a first p-type doping region 708, a second n-type doping region 710, and a second p-type doping region 705, which are stacked in sequential order. When the bias is applied, the second n-type doping region 710, the first p-type doping region 708 and the first n-type doping region 706 are fully depleted. As a result, the overall depletion region depth is increased. This increased depth, in turn, decreases the amount of photo-generated charge that is lost due to recombination in the normally undepleted substrate.

The first p-type doping region 708 has a doping concentration nearly the same or lower than the first and second n-type doping regions 706 and 710, and thus, the first p-type doping region 708 becomes fully depleted when a bias is applied.

Hence, when in a full depletion state, the photodiode illustrated in FIG. 2 often essentially behaves as a single junction capacitance.

As a result, since the size of the depletion region and the corresponding capacitance generally have an inverse relationship, the small pixel size sensors tend to have a low charge storage capacitance, which generally results in not enough electrons being stored in the pixels to generate a reasonable quality of image with a desirable high level of dynamic range (DR).

SUMMARY OF THE INVENTION

It is, therefore, an object of the present invention to provide a photodiode with a stratified doping arrangement, which allows formation of multiple junction capacitances in a photodiode region, so that the photodiode can be used in pixels of high performance CMOS image sensors, which have small size, high charge storage capacity, high DR, low dark current, and low operating voltage.

It is another object of the present invention to provide a pixel structure of a high performance CMOS image sensor obtained by incorporating a photodiode having a stratified doping arrangement implemented in shallow trench isolation (STI) technology.

In accordance with an aspect of the present invention, there is provided a photodiode for a pixel of a complementary metal oxide semiconductor (CMOS) image sensor, including: a semi-conductive layer of a first conductivity type; multiple doping regions of a second conductivity type formed to different depths in the semi-conductive layer; multiple doping regions of the first conductivity type formed between the multiple doping regions of the second conductivity type and forming multiple junction capacitances without full depletion when a bias voltage is applied to deplete the photodiode; and a pinning layer formed underneath the semi-conductive layer.

In accordance with another aspect of the present invention, there is provided a pixel of a complementary metal oxide semiconductor (CMOS) image sensor including: a semi-conductive layer of a first conductivity type; a shallow trench isolation (STI) region formed regionally in the semi-conductive layer; a pinned photodiode formed in the semi-conductive layer; and a transfer gate transferring photo-generated charge from the pinned photodiode to a sensing node, wherein the pinned photodiode includes: multiple doping regions of a second conductivity type formed to different depths in the semi-conductive layer; multiple doping regions of the first conductivity type formed between the multiple doping regions of the second conductivity type and forming multiple junction capacitances without full depletion when a bias voltage is applied to deplete the photodiode; and a pinning layer formed underneath the semi-conductive layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Exemplary embodiments of the present invention on a stratified photodiode for high resolution CMOS image sensor implemented with STI technology will be described in detail with reference to the accompanying drawings.

Figure 1:
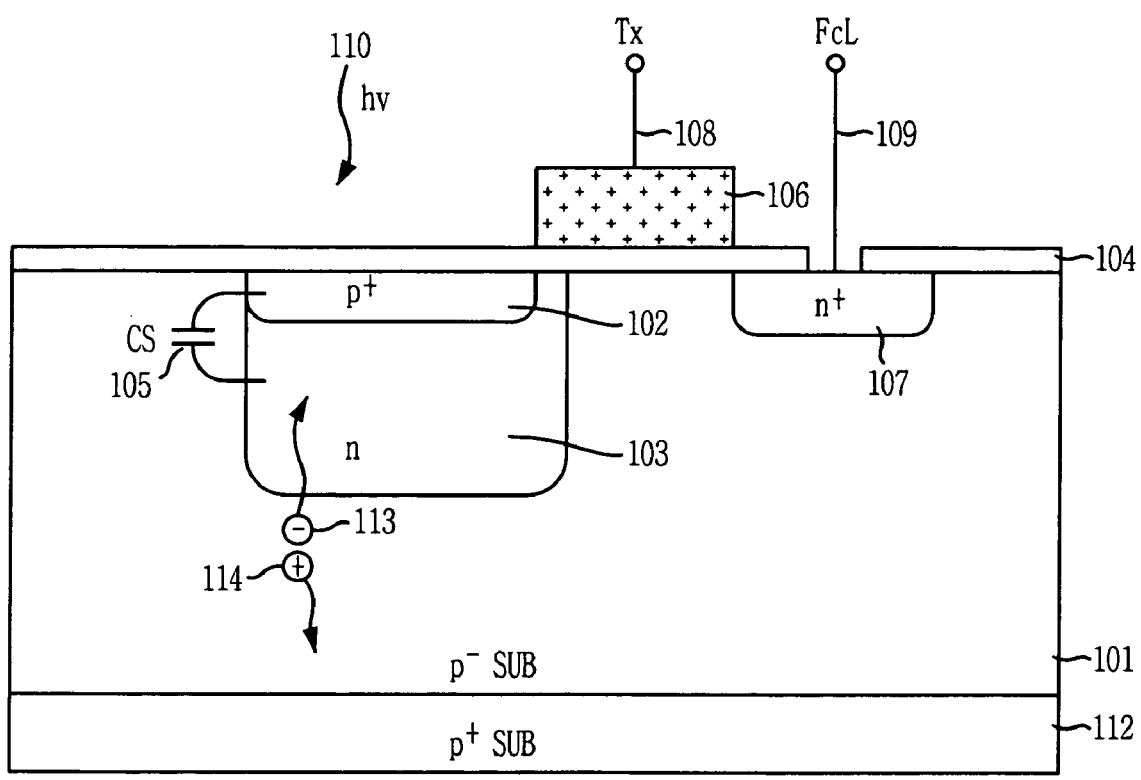
FIG. 1 is a simplified cross-sectional view illustrating a typical pinned photodiode structure of a CMOS image sensor pixel with 4 transistors.
Figure 2:
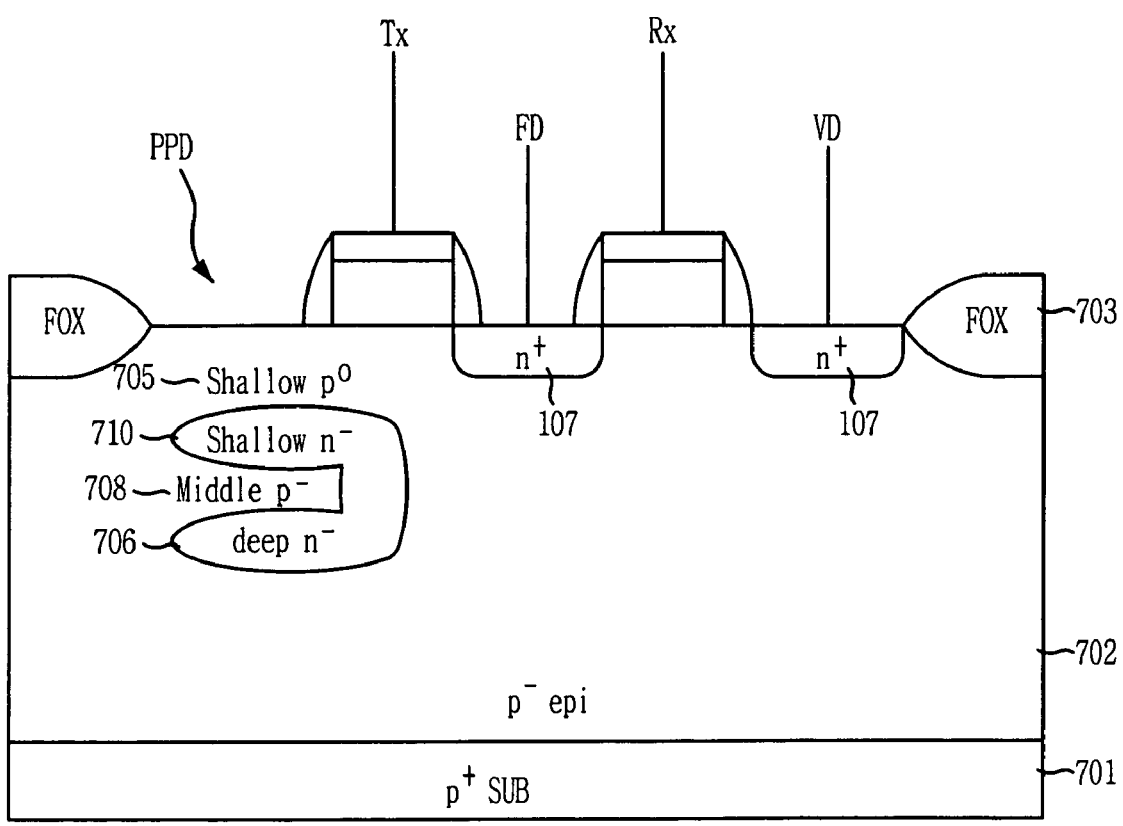
FIG. 2 is a simplified cross-sectional view illustrating another typical pinned photodiode structure.
Figure 3:
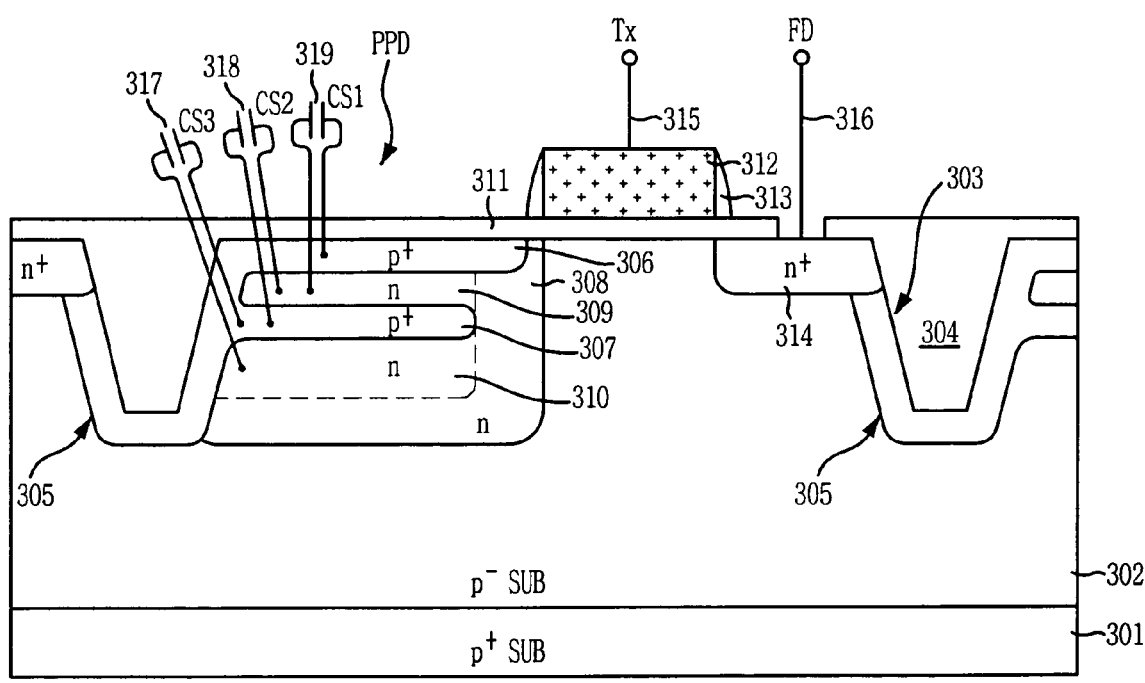
FIG. 3 is a simplified cross-sectional view illustrating a pinned photodiode structure with a stratified doping arrangement implemented with an STI technology in accordance with an embodiment of the present invention.

FIG. 3 is a simplified cross-sectional view illustrating a pixel structure of a CMOS image sensor with a pinned photodiode, which is constructed based on a stratified doping arrangement, in accordance with an embodiment of the present invention. In the pinned photodiode, multiple pn junction capacitances are formed since an intermediate p-type doping region is not fully depleted when a bias is applied.

Referring to FIG. 3, the CMOS image sensor pixel includes: a semi-conductive layer 302 formed over a highly doped $p^+$-type substrate 301 (hereinafter referred to as "substrate"); an STI region 304 formed regionally in the semi-conductive layer 302; a pinned photodiode PPD formed in the semi-conductive layer 302; and a transfer gate 312 to transfer photo-generated charge from the pinned photodiode PPD to a FD node 314, which is a sensing node. The semi-conductive layer 302 may be a lightly doped $p^-$-type epitaxial layer, and will be described as an exemplary layer in the present embodiment.

The pinned photodiode PPD includes first and second lightly doped n-type doping regions 310 and 309 and first and second highly doped $p^+$-type doping regions 307 and 306. The first and second lightly doped n-type doping regions 310 and 309 are formed to different depths in the lightly doped $p^-$-type epitaxial layer 302. The first highly doped $p^+$-type doping region 307 is formed between the first lightly doped n-type doping region 310 and the second lightly doped n-type doping region 309, and forms multiple junction capacitances without depletion when a bias is applied to the photodiode PPD. The second highly doped $p^+$-type doping region 306 is formed on top of the lightly doped $p^-$-type epitaxial layer 302 under the oxide layer 311 and serves as a pinning layer.

The first highly doped $p^+$-type doping region 307 has a doping concentration higher than the first and second lightly doped n-type doping regions 310 and 309 and the lightly doped $p^-$-type epitaxial layer 302. Hence, the first highly doped $p^+$-type doping region 307 is not fully depleted when the bias is applied, and forms capacitances 317 and 318 in between the first lightly doped n-type doping regions 310 and the second lightly doped n-type doping region 309. Compared with the conventional photodiode structure, the photodiode according to the present embodiment has increased capacitance by including three capacitances 317, 318 and 319 connected in parallel as shown in FIG. 3.

The first lightly doped n-type doping region 310 and the second lightly doped n-type doping region 309 are contiguous with each other in an n-type doping region 308 formed underneath one edge of the transfer gate 312. The CMOS image sensor pixel according to the present embodiment further includes another highly doped $p^+$-type doping region 305 serving as a field stop layer (hereinafter referred to as "field stop region"). The field stop region 305 is formed to be coupled with the second highly doped $p^+$-type doping region 306 (i.e., the pinning layer), the first lightly doped n-type doping region 310 and the second lightly doped n-type doping region 309. Hence, the field stop region 305 provides the substrate bias to the first highly doped p⁺-type doping region 307 and second highly doped p⁺-type doping region 306.

For the formation of the shallow STI region 304, a trench 303 is etched into the silicon surface and is filled with silicon dioxide. The silicon dioxide also covers the entire surface of the photodiode PPD and isolates the transfer gate 312 from the lightly doped p⁻-type epitaxial layer 302. The first highly doped p⁺-type doping region 307 and the second highly doped p⁺-type doping region 306 also minimize a dark current generation. The n-type doping region 308 forms the original p⁺n photodiode that is aligned with the transfer gate 312, and when the transfer gate 312 is turned on, the n-type doping region 308 provides the necessary connection to the FD node 314, which is doped with n⁺-type impurities. The correct doping profile and the alignment are achieved by using the sidewall dielectric extensions 313 as is well known in the industry. The transfer gate 312 is turned on by applying a bias thereto through a wire 315 shown in this drawing only schematically. A photo-generated signal is extracted from the FD node 314 via a lead 316 also shown in this drawing only schematically.

The stratified doping and the improvement of charge storage capacity of this photodiode structure are achieved by adding an additional p-type doping region (i.e., the first highly doped p⁺-type doping region 307) and two n-type doping regions (i.e., the first and second lightly doped n-type regions 310 and 309) into the original n-type doping region 308. The first highly doped p⁺-type doping region 307 is contiguous with the field stop region 305 and the second highly doped p⁺-type doping region 306, which provide the necessary substrate bias. As a result, two additional junction capacitances CS2 and CS3 (i.e., 318 and 317), which are connected in parallel to the original junction capacitance CS1 (i.e., 319), are formed. The additional capacitances improve the charge storage capacity of the diode and allow the diode to store enough charge at low-pinned voltage Vpin to form a high quality and high DR image.

It is clear to those skilled in the art that more stratified layers can be inserted and that various methods such as ion implantation and epitaxial growth can be employed to form the stratified layers. Detailed description thereof will not be provided.

Figure 4:
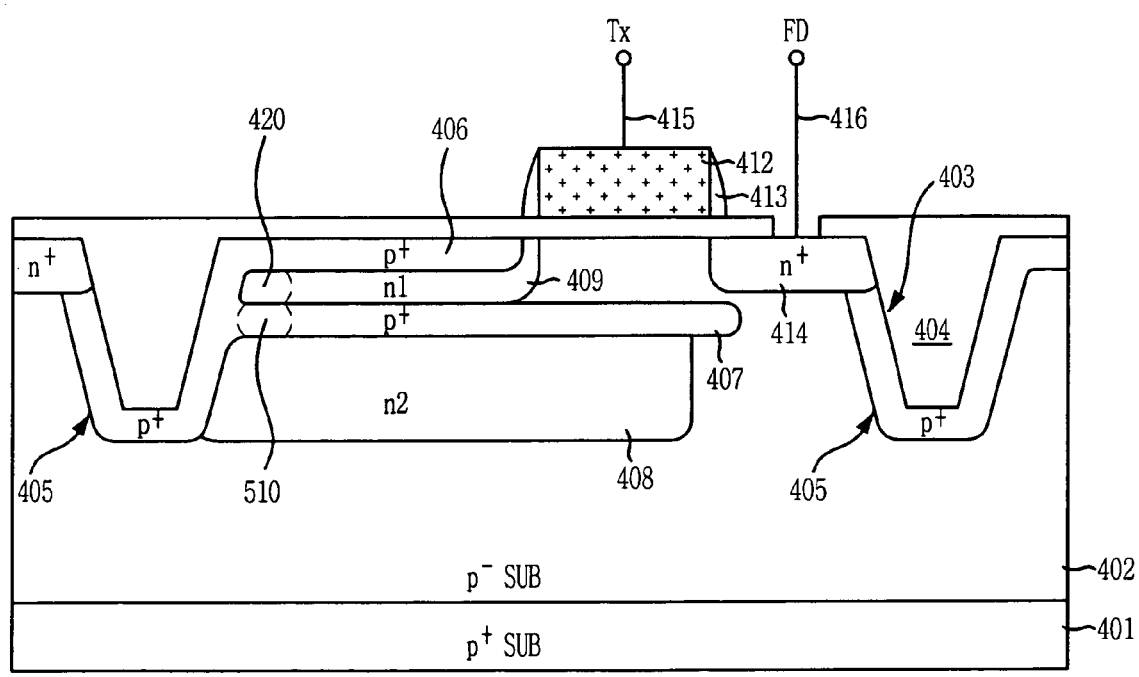
FIG. 4 is a simplified cross-sectional view illustrating a pinned photodiode structure with a stratified doping arrangement implemented with an STI technology in accordance with another embodiment of the invention.

For completeness and more clarity, another embodiment of the present invention is shown in FIG. 4. In this embodiment, a surface pinning layer 406 and STI structures 404 and 405 are substantially identical to the corresponding structures 306, 304 and 305 respectively in FIG. 3. Also, a transfer gate 412, sidewall regions 413, and a FD region 414 doped with an n⁺-type impurity are substantially identical to the corresponding regions 312, 313 and 314 in FIG. 3.

The difference is in a p⁺-type doping region 407 that extends under the transfer gate 312 and an n-type doping region 408 that does not require any contiguous connection to another n-type doping region 409 under the gate edge. Instead, the n-type doping continuity and the smooth potential profile from the n-type doping region 408 to the other n-type doping region 409 are achieved by placing a counter doping region 510 in the p⁺-type doping region 407 and another counter doping region 420 in the other n-type doping region 409. An additional counter-doping region (not shown) may also be placed in the n-type doping region 408 under the counter doping region 510 to provide a smooth potential profile transition. The connectivity and the substrate bias for the p⁺-type doping region 407 are provided in the direction perpendicular to the drawing, so that the proper device functionality is maintained as in the previous embodiment. Remaining structure elements such as a substrate 401, a p⁻-type epitaxial layer 402, an oxide layer 411, and leads 415 and 416 are identical to the regions 301, 302, 311, 315 and 316 shown in FIG. 3, respectively.

It is also clear to those skilled in the art that the stratified photodiode can be used in other types of pixels such as 3T, 5T, and 6T, in addition to 4T and that other types of material than the p-type doped silicon substrate can be used.

On the basis of the exemplary embodiments of the present invention, instead of having only one n-type and p-type layer sandwich built in the substrate that forms only one storage capacitance, it is shown that at least one more such layer sequence can be placed one top of the first one. This arrangement, thus, results in two more charge storage capacitances that are connected in parallel with the original one. Hence, this stratified doping layer arrangement substantially increases the charge storage capacity of the pixel without the need for increased operating voltage. As a result, it is possible to built high performance image sensors with high charge storage capacity and consequently high DR.

It is also possible to build pixels as small as approximately 2.0 μm or smaller that can operate at low voltages. Since the stratified doping arrangement is completely contained within the silicon bulk and no new regions of the photodiode are exposed to the interface, the original low dark current performance of the pinned photodiode pixel concept is also maintained in this arrangement. In addition, in comparison with the typical photodiode structure, the high electric fields in the described structure of the exemplary embodiments can be effectively optimized, and thus, the dark current further lowered, achieving better pixel to pixel uniformity, and better processing control.

The present application contains subject matter related to the Korean patent application Nos. KR 2005-0134243 and 2006-0038536, filed in the Korean Patent Office respectively on Dec. 29, 2005, and on Apr. 28, 2006, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A photodiode for a pixel of a complementary metal oxide semiconductor (CMOS) image sensor, comprising:
   a semi-conductive layer of a first conductivity type;
   multiple doping regions of a second conductivity type formed to different depths in the semi-conductive layer;
   multiple doping regions of the first conductivity type formed between the multiple doping regions of the second conductivity type and forming multiple junction capacitances without full depletion when a bias voltage is applied to deplete the photodiode;
   a pinning layer formed underneath a surface of an oxide layer; and
   a counter doping region formed in a portion of one of the multiple doping regions of the first conductivity type and provides a contiguous connection between the multiple doping regions of the second conductivity type disposed above and under the one of the multiple doping regions of the first conductivity type,
   wherein the multiple doping regions of the first conductivity type and the multiple doping regions of the second conductivity type are surrounded by a n-type doping region.

2. The photodiode of claim 1, wherein the multiple doping regions of the first conductivity type have a doping concentration higher than the semi-conductive layer and the multiple doping regions of the second conductivity type.

3. The photodiode of claim 1, wherein the multiple doping regions of the second conductivity type are contiguous with each other at one edge of the multiple doping regions of the first conductivity type.

4. The photodiode of claim 1, further comprising another counter doping region formed adjacent to the counter doping region in a portion of one of the multiple doping regions of the second conductivity type disposed above and under the one of the multiple doping regions of the first conductivity type.

5. The photodiode of claim 4, wherein the pinning layer is a first conductivity type.

6. The photodiode of claim 4, wherein the first conductivity type and the second conductivity type are complementary p and n types, respectively.

7. The photodiode of claim 4, wherein the pixel includes 4 transistors.

8. The photodiode of claim 4, wherein the pixel includes 3 transistors.

9. The photodiode of claim 4, wherein the semi-conductive layer is an epitaxial layer.

* * * * *

UNITED STATES PATENT AND TRADEMARK OFFICE
CERTIFICATE OF CORRECTION

PATENT NO. : 7,633,134 B2  Page 1 of 1
APPLICATION NO. : 11/435771
DATED : December 15, 2009
INVENTOR(S) : Jaroslav Hynecek It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 612 days.

Signed and Sealed this

Twenty-first Day of December, 2010

David J. Kappos
*Director of the United States Patent and Trademark Office*